(12) United States Patent
Ryu et al.

(10) Patent No.: US 8,384,135 B2
(45) Date of Patent: Feb. 26, 2013

(54) PHASE-CHANGE RANDOM ACCESS MEMORY DEVICE AND METHOD OF MANUFACTURING THE SAME

(75) Inventors: Cheol Hwi Ryu, Ichon (KR); Hyung Soon Park, Ichon (KR); Jong Han Shin, Ichon (KR); Jum Yong Park, Ichon (KR); Sung Jun Kim, Ichon (KR)

(73) Assignee: SK hynix Inc. (KR)

( * ) Notice: Subject to any disclaimer, the term of this patent is extended or adjusted under 35 U.S.C. 154(b) by 17 days.

(21) Appl. No.: 13/164,490

(22) Filed: Jun. 20, 2011

(65) Prior Publication Data

US 2011/0240950 A1 Oct. 6, 2011

Related U.S. Application Data

(62) Division of application No. 12/146,179, filed on Jun. 25, 2008, now Pat. No. 7,981,797.

(30) Foreign Application Priority Data

Nov. 21, 2007 (KR) ......................... 10-2007-0119150

(51) Int. Cl.
*H01L 27/148* (2006.01)
*H01L 29/768* (2006.01)

(52) U.S. Cl. ............... 257/246; 257/288; 257/E21.006; 257/E21.17; 257/E21.229; 257/E21.267; 257/E21.275; 257/E21.314; 257/E21.346

(58) Field of Classification Search ............... 257/246, 257/249, 288, 396, 296, E21.006, E21.17, 257/E21.229, E21.267, E21.275, E21.314, 257/E21.346

See application file for complete search history.

(56) References Cited

U.S. PATENT DOCUMENTS

| 6,511,862 | B2 | 1/2003 | Hudgens et al. |
| 6,815,704 | B1 * | 11/2004 | Chen ................................ 257/2 |
| 7,442,602 | B2 | 10/2008 | Park et al. |
| 7,450,415 | B2 | 11/2008 | Kim et al. |
| 7,981,797 | B2 * | 7/2011 | Ryu et al. ..................... 438/675 |
| 2003/0209746 | A1 | 11/2003 | Horii |
| 2007/0252127 | A1 | 11/2007 | Arnold et al. |

FOREIGN PATENT DOCUMENTS

| KR | 1020060001056 | 1/2006 |
| KR | 1020060001091 | 1/2006 |
| KR | 1020070094194 | 9/2007 |

* cited by examiner

*Primary Examiner* — David Nhu
(74) *Attorney, Agent, or Firm* — Baker & McKenzie LLP

(57) ABSTRACT

A phase-change random access memory device includes a semiconductor substrate, a bottom electrode structure formed on the semiconductor substrate, a cylindrical bottom electrode contact that includes a conductive material layer, which is in contact with the bottom electrode, and a cylindrical phase-change material layer that is in contact with the bottom electrode contact. Therefore, the contact area between the bottom electrode contact and the phase-change material layer can be minimized.

14 Claims, 10 Drawing Sheets

PHASE-CHANGE RANDOM ACCESS MEMORY DEVICE AND METHOD OF MANUFACTURING THE SAME

CROSS-REFERENCES TO RELATED APPLICATION

This is a divisional application of U.S. patent application Ser. No. 12/146,179, filed Jun. 25, 2008, titled "A Phase-Change Random Access Memory Device and Method of Manufacturing the Same," the disclosure of which is incorporated herein in its entirety by reference as if set forth in full, and which claims priority under 35 U.S.C. 119(a) to Korean Patent Application No. 10-2007-0119150, filed on Nov. 21, 2007, in the Korean Intellectual Property Office, the disclosure of which is incorporated herein in its entirety by reference as if set forth in full.

BACKGROUND OF THE INVENTION

1. Technical Field

The embodiments described herein relate to a phase-change random access memory device, and in particular, to a phase-change random access memory device that is capable of minimizing the size of a bottom electrode contact, and a method of manufacturing the same.

2. Related Art

Phase-change Random Access Memory (PRAM) devices have been developed in part to overcome certain limitations of existing memory devices, such as Dynamic Random Access Memories (DRAMs), Static Random Access Memories (SRAMs), and flash memories.

A PRAM is a memory device that writes and reads out information on the basis of a reversible phase change of a phase-change material, which has high resistance in an amorphous state and low resistance in a crystalline state. A PRAM device can provide higher operational speed and a higher degree of integration than, e.g., a conventional flash memory device.

FIG. 1 is a graph illustrating the operation principle of a PRAM device.

As shown in FIG. 1, when the phase-change material layer is heated at a temperature higher than a melting temperature Tm for a short time (first operation period: t1), and then cooled at high speed as represented by curve (A), a phase-change material layer is changed to the amorphous state. In contrast, when the phase-change material layer is heated at a temperature lower than the melting temperature Tm and higher than a crystallization temperature Tc for a time (second operation period: t2) longer than the first operation period t1, and then cooled as represented by curve (B), then the phase-change material layer is changed to the crystalline state.

Here, the resistivity of the phase-change material layer in the amorphous state is higher than the resistivity of the phase-change material layer in the crystalline state. Accordingly, in a read mode, it is possible to determine whether or not the information stored in the PRAM device is a logic level '1' or a logic level '0' by detecting a current flowing in the phase-change material layer.

As such, when a high-density current flows through a contact area to the phase-change material layer of the PRAM device, the crystalline state of the contact surface of the phase-change material layer is changed. As the contact area becomes small, the density of a current required for changing the state of the phase-change material can be reduced. To this end, a method that forms a bottom electrode contact in a plug shape has been introduced.

FIG. 2 is a diagram illustrating the structure of a conventional PRAM device having a plug-shaped bottom electrode contact.

As shown in FIG. 2, an interlayer insulating film 3 is formed on a semiconductor substrate 1, on which a bottom electrode 2 is formed, and a hard mask 4 is formed on the interlayer insulating film 3. Next, a cylindrical bottom electrode contact hole is formed by exposure and etching.

Subsequently, a metal that generates Joule heat required for phase change is filled into the bottom electrode contact hole to form a bottom electrode contact (BEC) 5. Next, a phase-change material layer (not shown) and a top electrode (not shown) are sequentially formed.

In a conventional PRAM device, however, since the contact area of a phase-change material layer pattern and the BEC entirely depends on photolithography and etching on the BEC hole, there is a difficulty in reducing the contact area. Accordingly, the amount of a current required for phase change is increased, which makes it difficult to achieve low power consumption and high integration. In addition, a variation occurs in the area of the BEC, which is formed by photolithography and etching, which results in deterioration of the reliability of the memory device.

SUMMARY

A PRAM device that is capable of minimizing the size of a bottom electrode contact, regardless of the limits of photolithography, and a method of manufacturing the same is described herein as is a highly integrated PRAM device that can minimize a rest current by forming a cylindrical and filled bottom electrode contact.

According to one aspect, a method of manufacturing a phase-change random access memory device includes forming an interlayer insulating film on a semiconductor substrate, on which a bottom structure is formed, patterning the interlayer insulating film to form a contact hole, forming a spacer on the side wall of the contact hole, forming a dielectric layer in the contact hole, and removing the spacer to form a bottom electrode contact hole.

According to another aspect, a method of manufacturing a phase-change random access memory device includes forming an interlayer insulating film and a mask on a semiconductor substrate, on which a bottom structure is formed, patterning the interlayer insulating film and the mask to form a bottom electrode contact hole, sequentially forming a conductive material layer and a dielectric layer on the semiconductor substrate, on which the bottom electrode contact hole is formed, planarizing the dielectric layer so as to expose the surface of the conductive material layer, removing the conductive material layer at the top and side wall of the mask to form a hole between the mask and the dielectric layer, forming a phase-change material layer so as to fill the hole between the mask and the dielectric layer, and planarizing the phase-change material layer so as to expose the surface of the mask.

According to still another aspect, a phase-change random access memory device includes a semiconductor substrate, a bottom electrode that is formed on the semiconductor substrate, a cylindrical bottom electrode contact that includes a conductive material layer, which is in contact with the bottom electrode, and a cylindrical phase-change material layer that is in contact with the bottom electrode contact.

These and other features, aspects, and embodiments are described below in the section entitled "Detailed Description."

DETAILED DESCRIPTION

As explained below, a PRAM device configured in accordance with the embodiments described herein can comprise an electrode contact the bottom of which can be formed regardless of the limits of photolithography and etching, thereby minimizing a contact area between the bottom electrode contact and a phase-change material layer. Therefore, the operational current of the PRAM device can be reduced, and the degree of integration can be increased. In addition, a variation in the area of the bottom electrode contact can be minimized, and thus the reliability of the device can be improved. Furthermore, when the phase-change material layer is formed to fill the contact hole, the contact area between the phase-change material layer and the top electrode can be minimized, thereby improving the adhesion between the phase-change material layer and the top electrode.

FIGS. 3A to 3G are cross-sectional views illustrating a method of manufacturing a PRAM device according to an embodiment of the invention in sequence.

Figure 1:
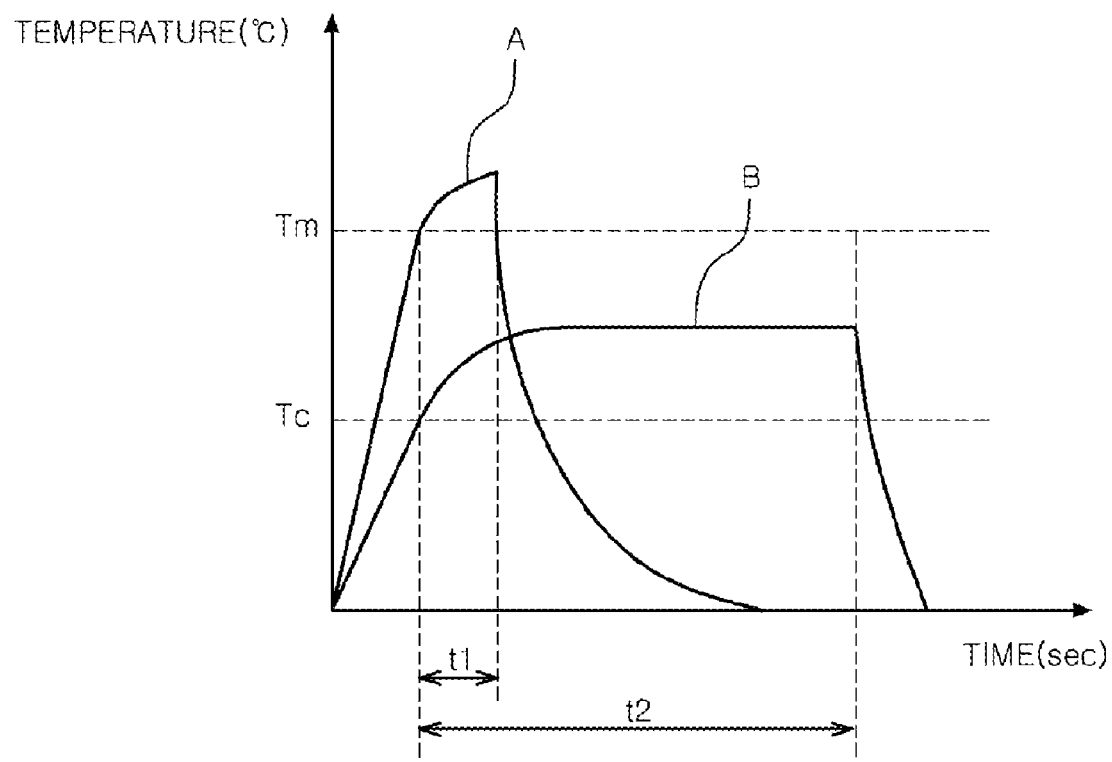
FIG. 1 is a graph illustrating the operation principle of a conventional phase-change random access memory device.
Figure 2:
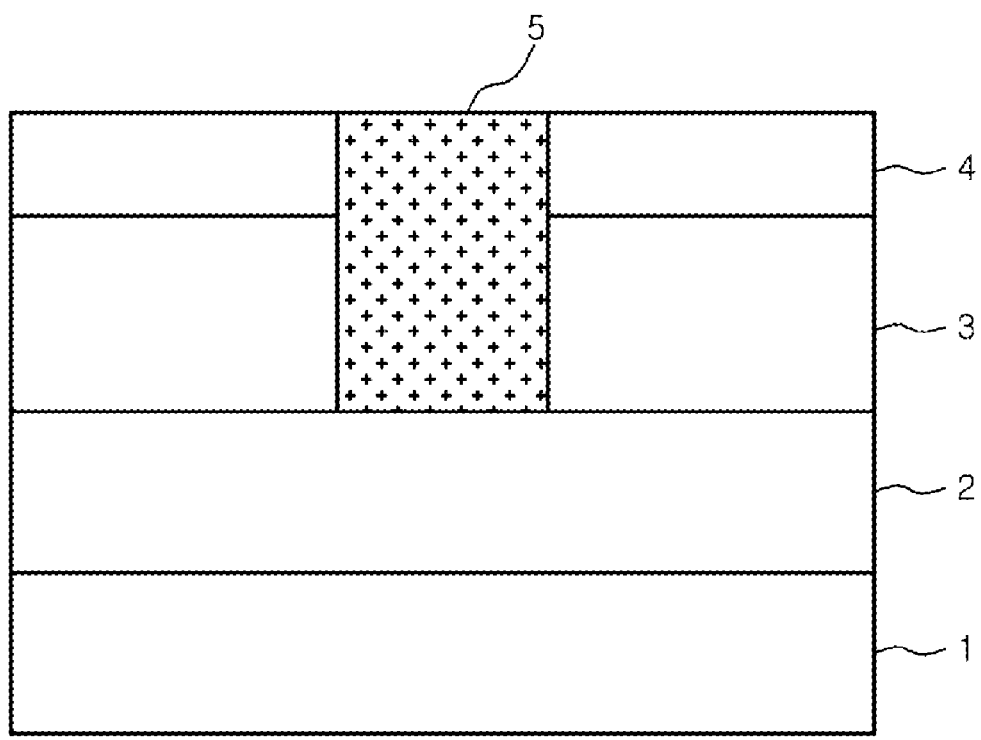
FIG. 2 is a diagram illustrating the structure of a conventional phase-change random access memory device having a cylindrical bottom electrode contact.
Figure 3A:
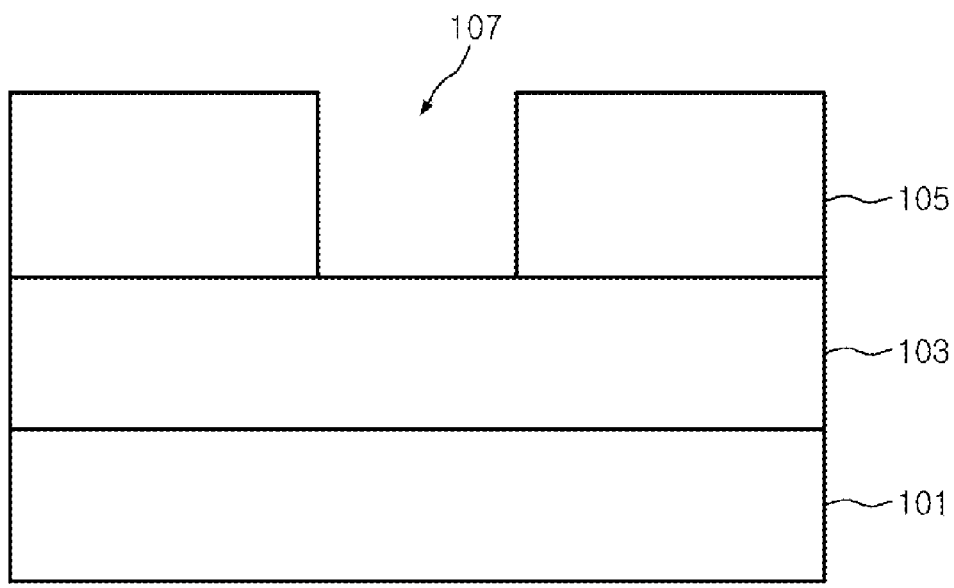
FIGS. 3A to 3G are cross-sectional views illustrating a method of manufacturing a phase-change random access memory device according to one embodiment.

First, as shown in FIG. 3A, a bottom electrode 103 and an interlayer insulating film 105 are sequentially formed on a semiconductor substrate 101 on which a bottom structure is formed. Then, a predetermined region of the interlayer insulating film 105 can be removed to expose the bottom electrode 103, to thereby form a contact hole 107.

It will be understood that hole 107 can be formed using well known photolithography techniques comprising the formation of a mask layer and etching to form the hole 107. Accordingly, the process of forming hole 107 will not be described in detail here for the sake of brevity.

Figure 3B:
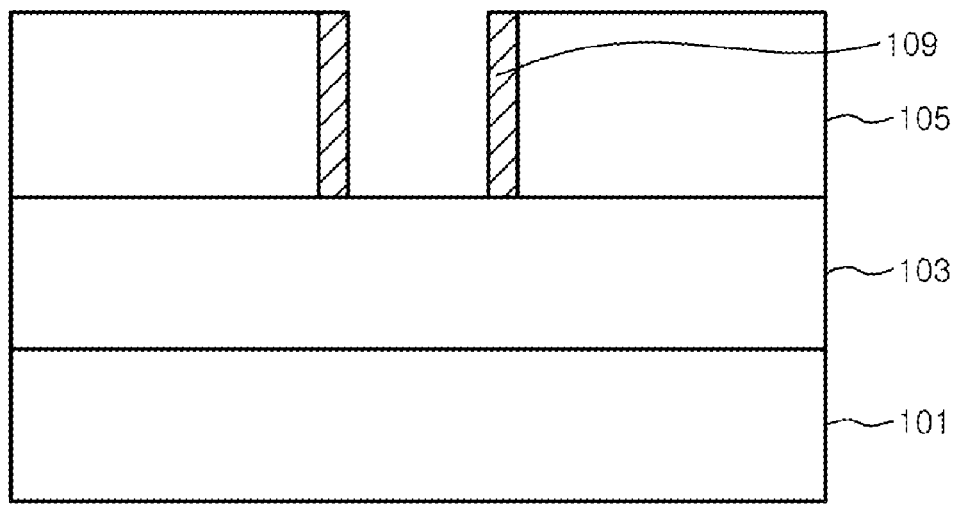

While not shown in FIG. 3B, an insulating material can be formed on the entire structure, and can be etched to expose the bottom electrode 103 at the bottom of the contact hole 107. A spacer 109 can then be formed on the side wall of the contact hole 107, e.g., by further etching the insulating material. Again, the process of forming an etching the insulating layer can be performed using conventional techniques, which will not be described here for the sake of brevity.

Further, in certain embodiments, a nitride material can be used as the insulating material. In addition, since the thickness of a subsequent BEC is determined on the basis of the thickness of the spacer 109 formed at this step, the nitride layer can be formed as thin as possible.

Figure 3C:
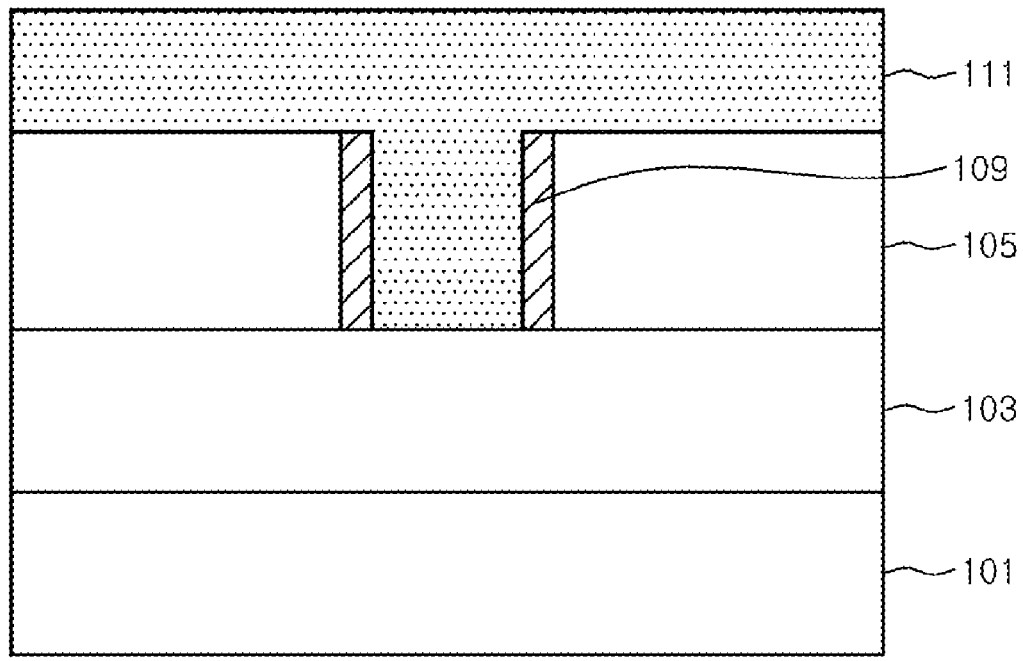
Figure 3D:
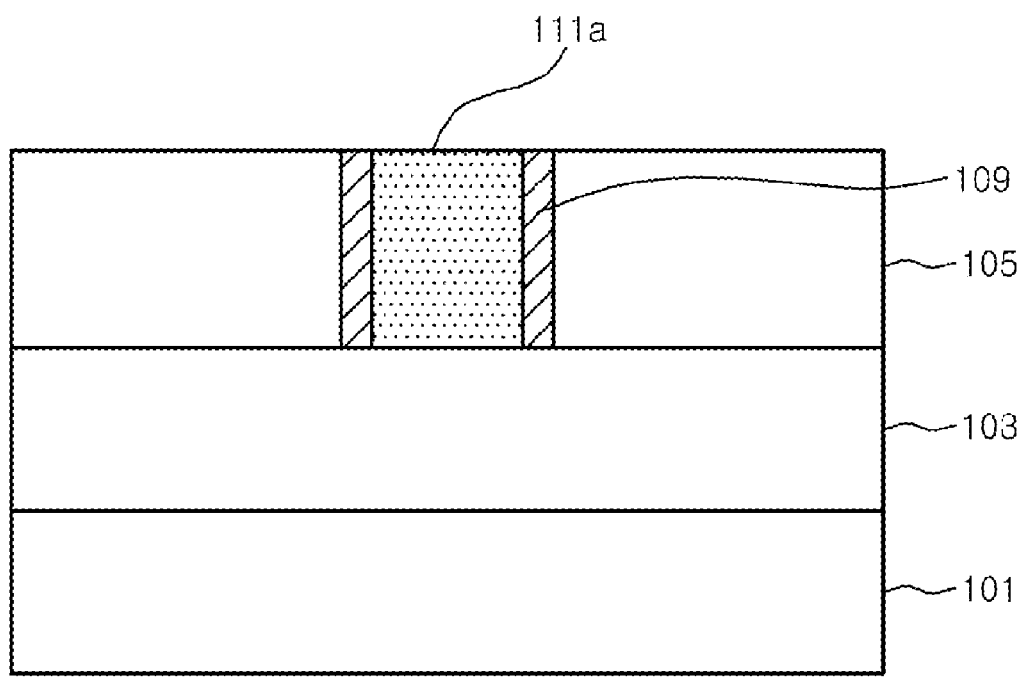

Next, as shown in FIG. 3C, a dielectric layer 111 can be formed on the entire structure, and planarization can be performed such that a dielectric layer 111a filing the contact hole 107 remains, as shown in FIG. 3D. Depending on the embodiment, the dielectric layer 111 can preferably be formed of a material having an excellent filling property, such as BPSG (BoroPhospho Silicate Glass), APL (Advanced Planarization Layer), SOD (Spin On Dielectric), or PSZ SOD (perhydro poly silazane SOD).

In embodiments that use PSZ SOD, since a liquid dielectric material is filled into the contact hole 107, the dielectric material can be filled regardless of the size of the contact hole 107.

Figure 3E:
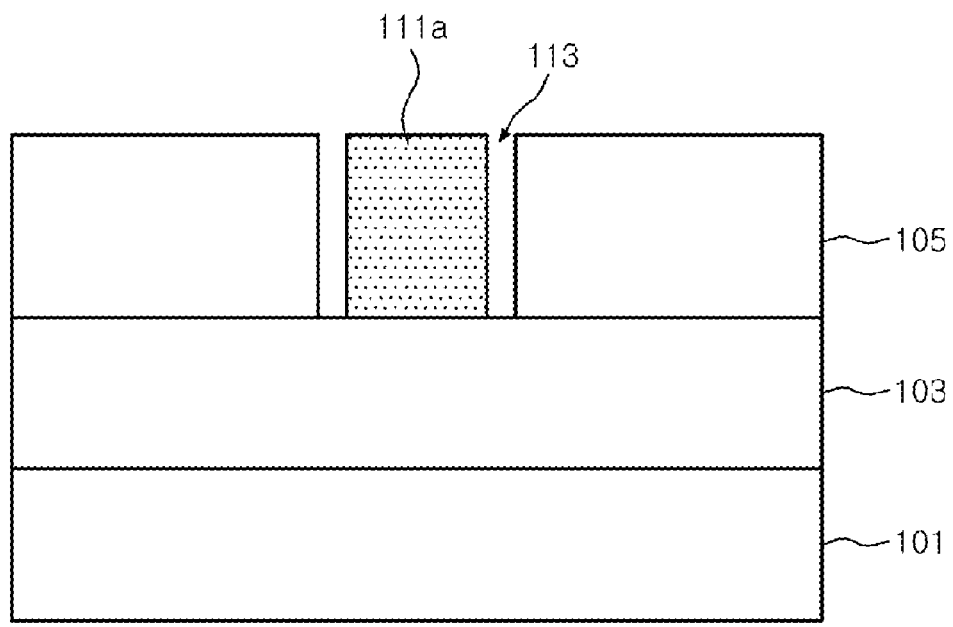

Next, the spacer 109 is removed so as to expose the surface of the bottom electrode 103, to thereby form a cylindrical bottom electrode contact hole 113, as shown in FIG. 3E. For example, the spacer 109 can be removed by wet etching.

Figure 3F:
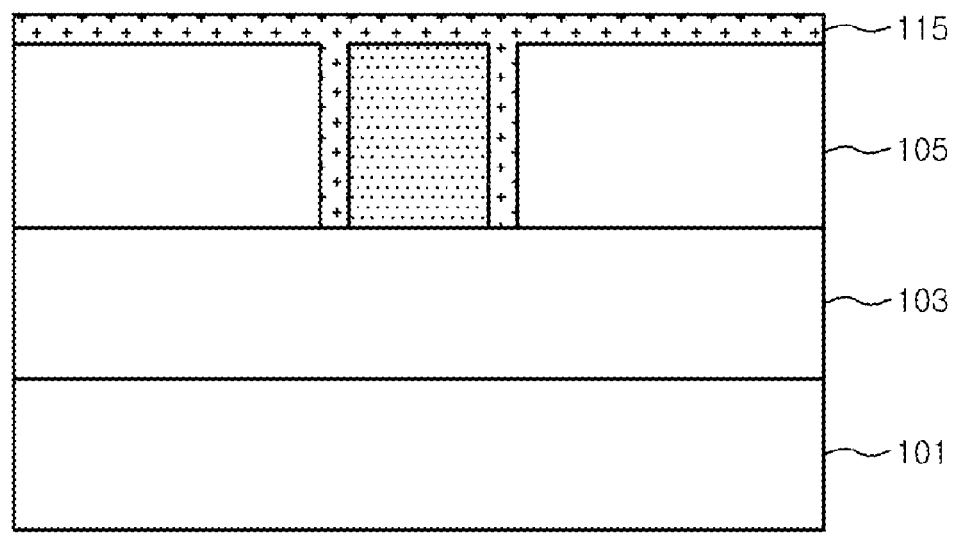
Figure 3G:
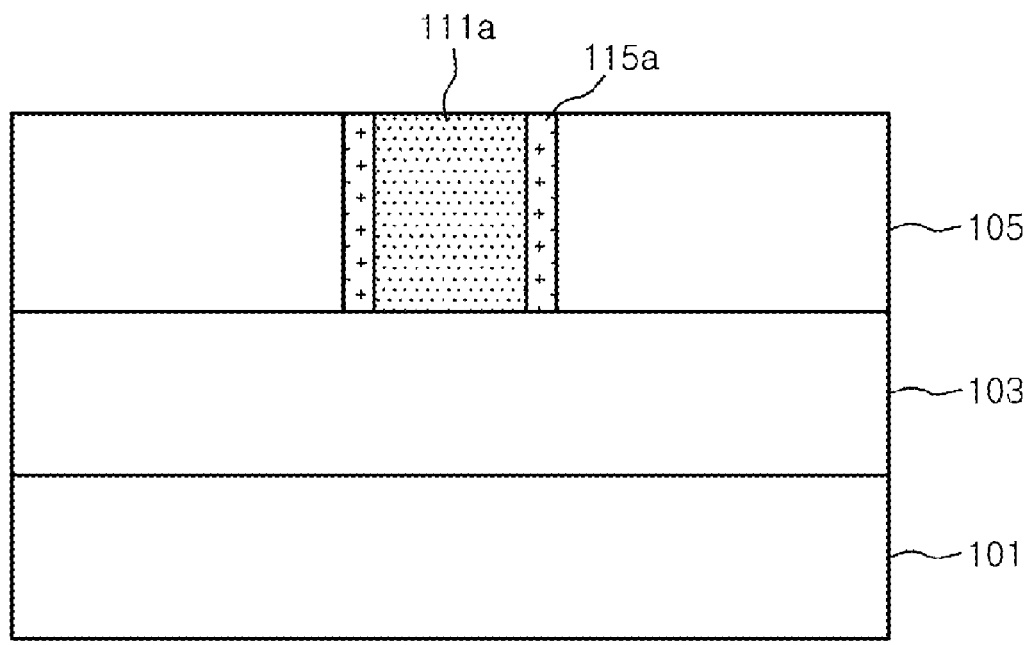

Next, as shown in FIG. 3F, a conductive material layer 115 can be formed on the entire structure so as to fill the bottom electrode contact hole 113, and planarization is performed such that only the conductive material layer 115a remains in the bottom electrode contact hole 113, as shown in FIG. 3G. In this way, the bottom electrode contact (BEC) is completed.

Here, the conductive material layer 115 can be formed of from, e.g., titanium nitride (TiN), tungsten (W), cobalt (Co), nickel (Ni), titanium (Ti), or ruthenium (Ru). In addition, the conductive material layer 115 can be deposited using atomic layer deposition (ALD). In such embodiments, the deposition cycle can, e.g., be 1 to 500 times.

Though not shown, the above-described steps can be performed in a state in which a mask for forming the contact hole 107 is not removed. In this case, the mask may be formed from a nitride, polysilicon, or an amorphous carbon, which has a predetermined selection ratio during the planarization of the dielectric layer 111.

Figure 4:
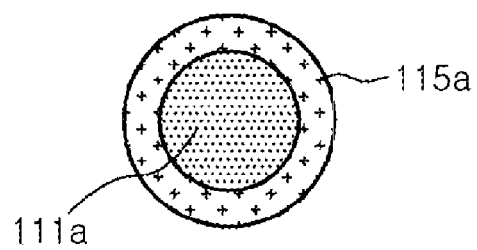
FIG. 4 is a plan view of a bottom electrode contact in a phase-change random access memory device shown in FIG. 3G.

FIG. 4 is a partial plan view of a bottom electrode contact that is formed in the above-described manner. Referring to FIG. 4, it can be seen that the inner portion of the cylindrical bottom electrode contact is formed from the dielectric layer 111a, and the outer portion is formed from the conductive material layer 115a. Further, the conductive material layer 115a forming the outer portion can be formed by the formation and then removal of spacer 109, without depending on photolithography and etching. Therefore, the thickness of the BEC can be minimized by simply adjusting the thickness of the spacer 109.

FIGS. 5A to 5G are cross-sectional views illustrating a method of manufacturing a phase PRAM device according to another embodiment.

Figure 5A:
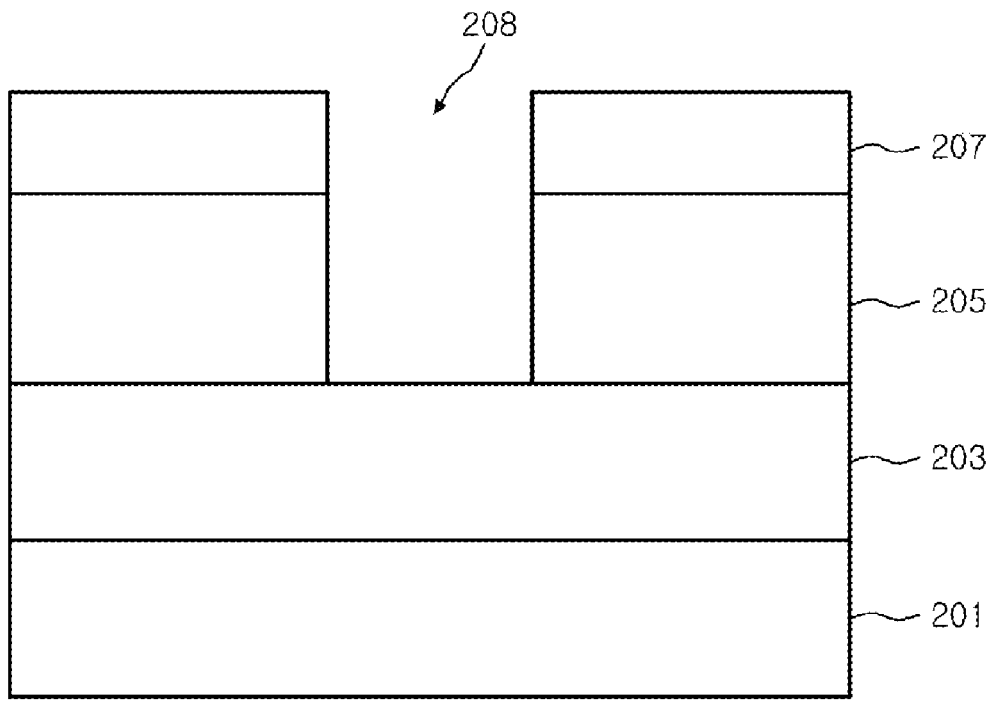
FIGS. 5A to 5G are cross-sectional views illustrating a method of manufacturing a phase-change random access memory device according to another embodiment.

First, as shown in FIG. 5A, a bottom electrode 203, an interlayer insulating film 205, and a hard mask 207 are sequentially formed on a semiconductor substrate 201. Then, a predetermined region of the interlayer insulating film 205 can be removed by photolithography and etching so as to expose the surface of the bottom electrode 203, to thereby form a bottom electrode contact hole 208.

The hard mask 207 can be provided to prevent the interlayer insulating film 205 from being damaged during etching, and it can be omitted depending on the requirements of a specific implementation.

Figure 5B:
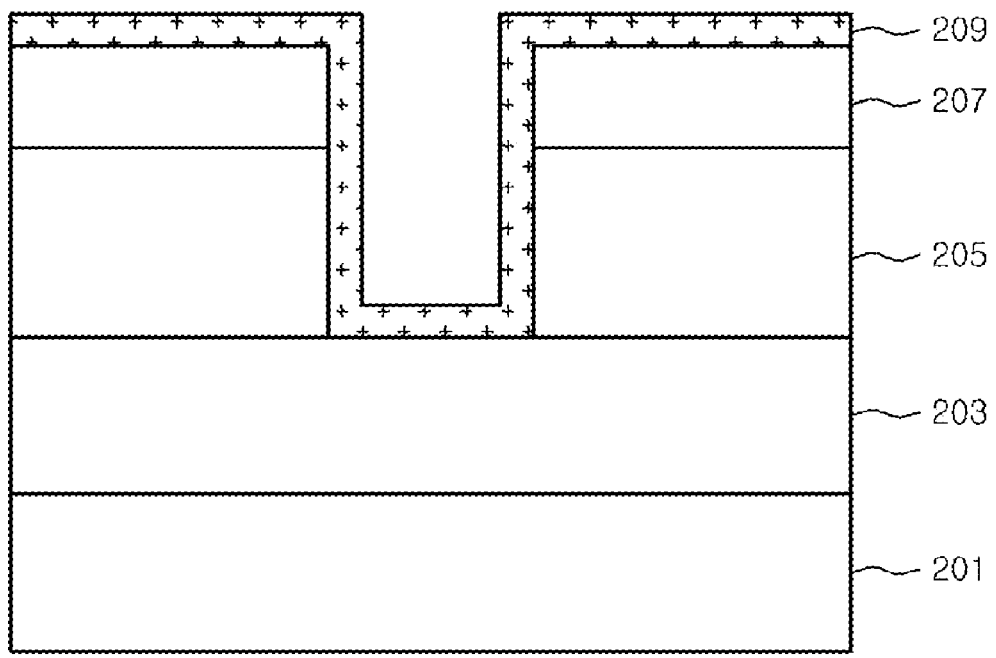
Figure 5C:
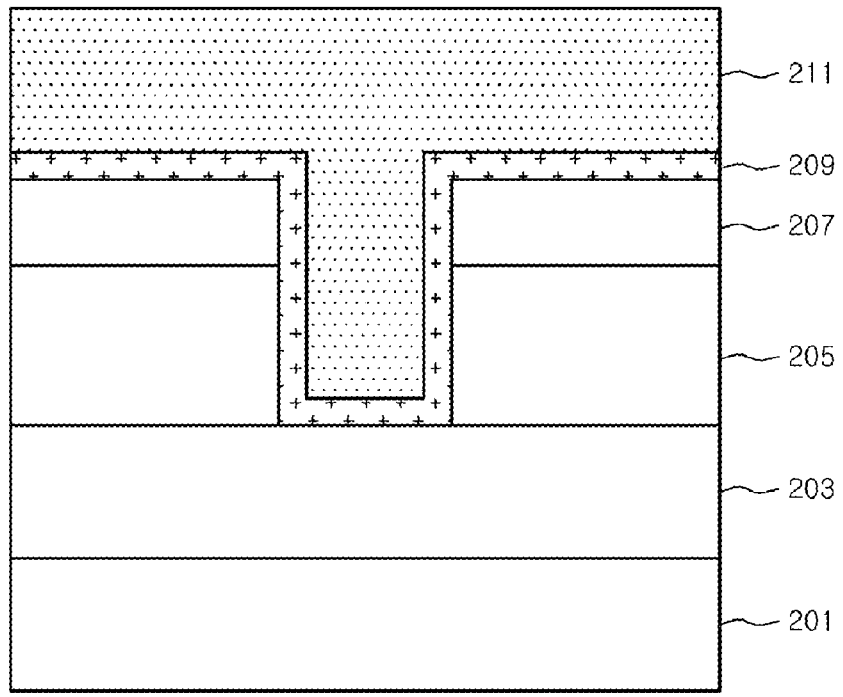

Next, as shown in FIGS. 5B and 5C, a conductive material layer 209 and a dielectric layer 211 are sequentially formed on the entire structure.

Depending on the embodiment, the conductive material layer 209 can be formed from a refractory metal selected, such as titanium (Ti), titanium nitride (TiN), tantalum (Ta), tantalum nitride (TaN), zirconium (Zr), hafnium (Hf), vanadium (V), nickel (Ni), molybdenum (Mo), tungsten (W), cobalt (Co), and ruthenium (Ru). The conductive material layer 209 can, e.g., be deposited by an atomic layer deposition (ALD) method. In addition, the deposition cycle can be 1 to 500 times. The size of the bottom electrode contact can be controlled by adjusting the deposition cycle.

The dielectric layer 111 can, e.g., be formed of material having an excellent filling property, such as BPSG (Boro-Phospho Silicate Glass), APL (Advanced Planarization Layer), SOD (Spin On Dielectric), or PSZ SOD (perhydro poly silazane SOD). In particular, when PSZ SOD is used, since a liquid dielectric material is filled into the contact hole 107, the dielectric material can be filled regardless of the size of the contact hole 107.

Figure 5D:
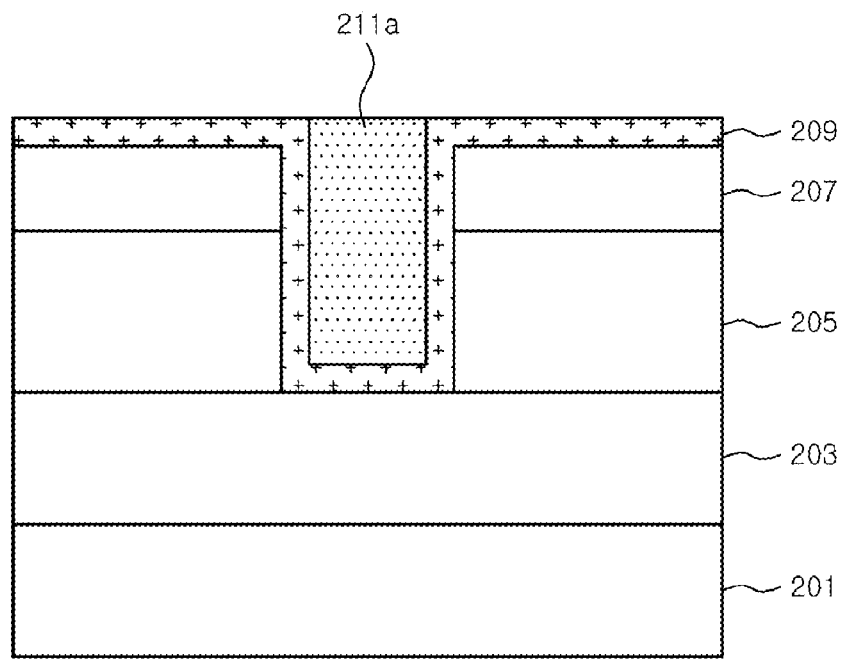

Next, planarization can be performed so as to remove the dielectric layer 211, to thereby expose the surface of the conductive material layer 209. The section after the planarization is shown in FIG. 5D. To this end, during the planarization, slurry having a selection ratio of 10:1 to 100:1 with respect to the conductive material layer 209 is preferably used.

Figure 5E:
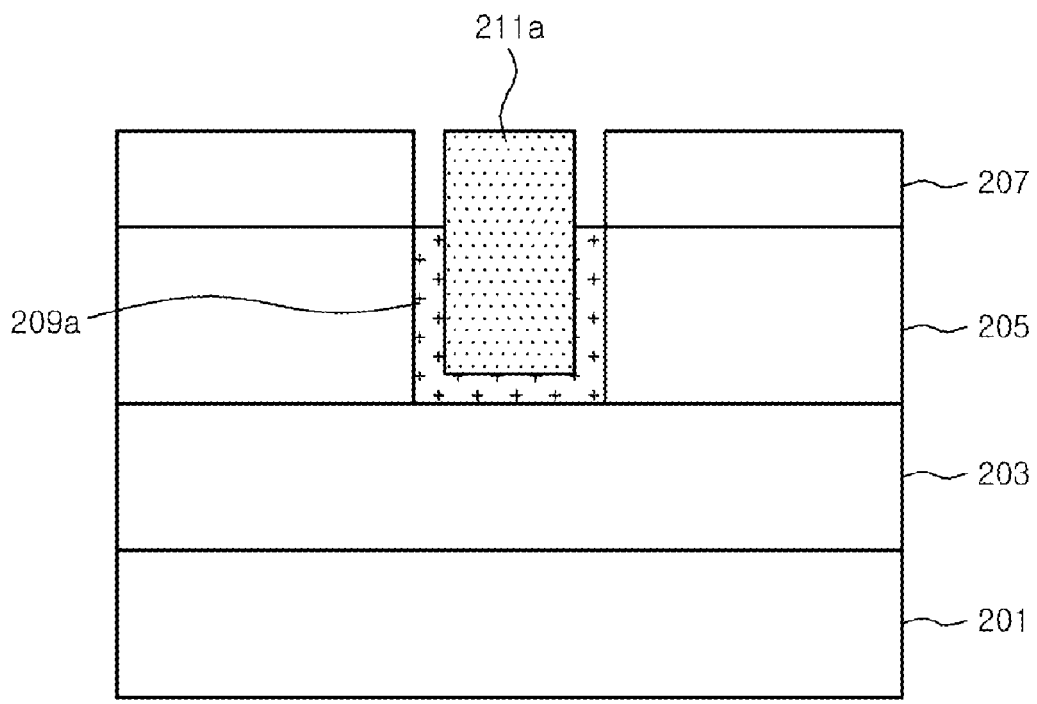

Next, as shown in FIG. 5E, the conductive material layer 209 exposed at the top and side walls of the mask 207 is removed, such that a cylindrical bottom electrode contact 209a is formed on the side wall of the interlayer insulating film 205. Here, the conductive material layer 209 can be removed, for example, by an etch-back process.

Figure 5F:
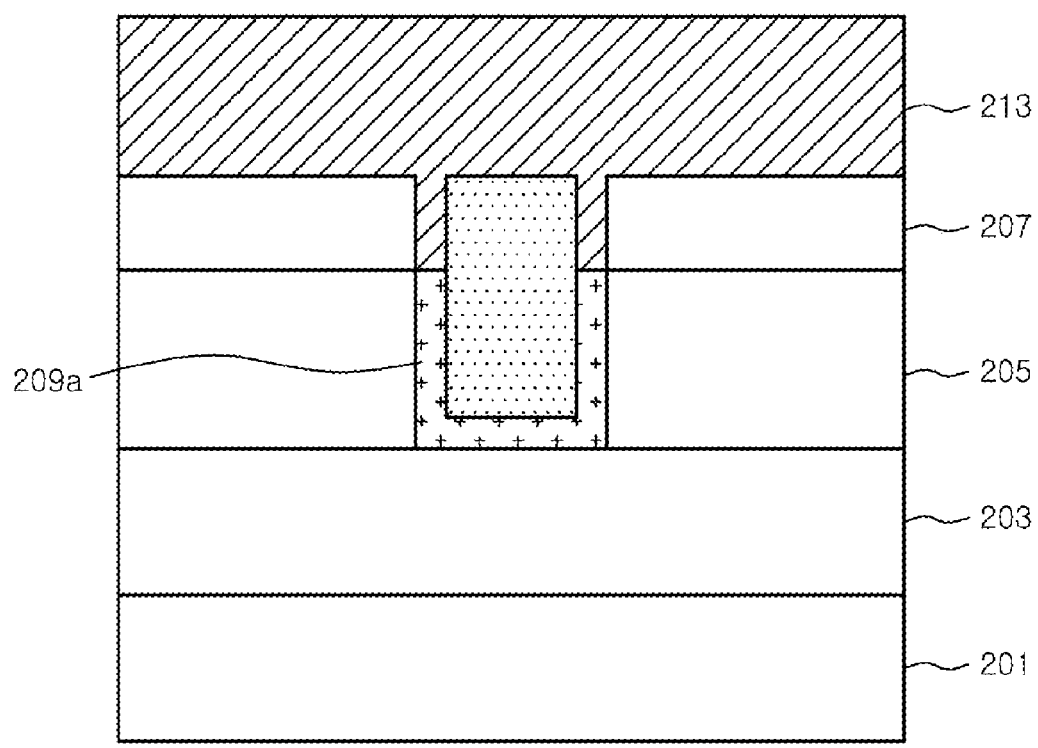

Next, as shown in FIG. 5F, a phase-change material layer 213 can be formed on the entire structure. For example, the phase-change material layer 213 can be deposited by a CVD method or an ALD method.

Figure 5G:
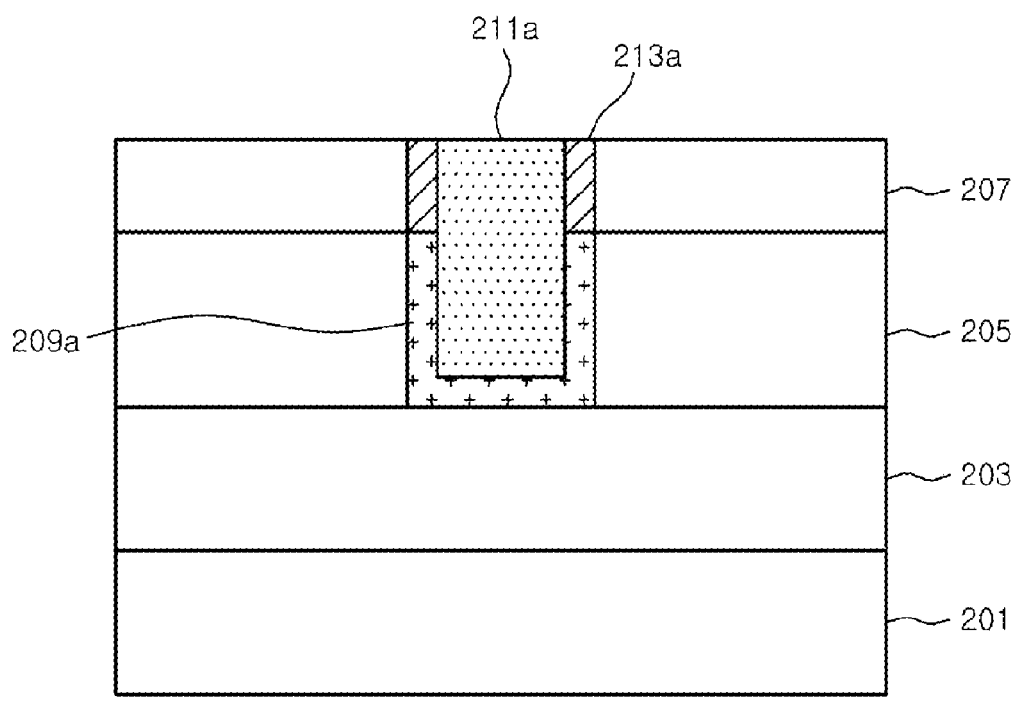

Subsequently, as shown in FIG. 5G, planarization can be performed so as to expose the surface of the mask 207, such that the phase-change material layer 213a is insulated from neighboring cells. Depending on the embodiment, the phase-change material layer 213 can preferably be planarized using slurry having a selection ratio of 10:1 to 100:1 with respect to the mask 207.

Figure 6:
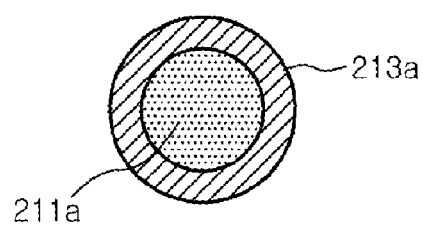
FIG. 6 is a plan view of a bottom electrode contact in a phase-change random access memory device shown in FIG. 5G.

FIG. 6 is a partial plan view of the BEC in the PRAM device formed in the manner described in FIGS. 5A-5G.

As shown in FIG. 6, it can be seen that the bottom electrode contact and the phase-change material layer are both in a cylindrical shape. In addition, the inner portion of the cylindrical phase-change material layer is filled with the dielectric layer 211a, and outer portion is surrounded with the phase-change material layer 213a.

When the phase-change material layer is formed in the above-described manner, the contact area between the top electrode and the phase-change material layer is minimized. Therefore, defective adhesion can be suppressed, and accordingly the reliability of the device can be improved.

In a conventional PRAM device, since the bottom electrode contact is formed by photolithography and etching, the limitation inherent in conventional photolithography and etching processes can have a limiting effect. But in the embodiments described above, since the bottom electrode contact is formed via a spacer and without depending on photolithography and etching, the area of the bottom electrode contact can be sufficiently reduced by adjusting the thickness of the spacer. Therefore, the operation current of the device can be reduced, and the integration can be significantly improved.

In addition, since the bottom electrode and the phase-change material layer are both in a cylindrical shape, the contact area at the top electrode can be reduced. Therefore, defective adhesion between the phase-change material layer and the top electrode can be suppressed.

As a result, the reliability of the device can be improved, and the yield can be increased, both of which are important especially in portable apparatus, such as a cellular phone, a PDA, or a mobile PC, which require a highly integrated memory device.

It will be apparent to those skilled in the art that various modifications and changes may be made without departing from the scope and spirit of the embodiments described herein. Therefore, it should be understood that the above embodiments are not limitative, but illustrative in all aspects. The scope of the above embodiments are defined by the appended claims rather than by the description preceding them, and therefore all changes and modifications that fall within metes and bounds of the claims, or equivalents of such metes and bounds are therefore intended to be embraced by the claims.

What is claimed is:

1. A phase-change random access memory device, comprising:
   a semiconductor substrate;
   a bottom electrode that is formed on the semiconductor substrate;
   a cylindrical bottom electrode contact that includes a conductive material layer, which is in contact with the bottom electrode; and
   a cylindrical phase-change material layer that is in contact with the cylindrical bottom electrode contact.

2. The phase-change random access memory device of claim 1, further comprising:
   a circular cylindrical dielectric layer that extends from the cylindrical bottom electrode contact in a lengthwise direction, wherein
   the cylindrical bottom electrode contact is formed on a surface of the circular cylindrical dielectric layer.

3. The phase-change random access memory device of claim 1, wherein the cylindrical bottom electrode contact and the cylindrical phase-change material layer include a dielectric layer therein.

4. The phase-change random access memory device of claim 1, further comprising an interlayer insulating film that is formed to surround the cylindrical bottom electrode contact.

5. The phase-change random access memory device of claim 1, further comprising a mask that is formed to surround the cylindrical phase-change material layer.

6. A phase-change random access memory device, comprising:
   a semiconductor substrate;
   a first bottom electrode that is formed on the semiconductor substrate;
   a second bottom electrode formed on the first bottom electrode, and including a bottom part in contact with the first bottom electrode, and sidewalls extended from edges of the first bottom electrode in an upper direction;
   a cylindrical phase-change material layer that is in contact with the sidewalls of the second bottom electrode; and
   a circular cylindrical dielectric layer filled in a region that is defined by the second bottom electrode and the cylindrical phase-change material layer.

7. The phase-change random access memory device of claim 6, wherein the first and second bottom electrodes are formed of conductive material.

8. The phase-change random access memory device of claim 6, further comprising an interlayer insulating film that is formed to surround the second bottom electrode.

9. The phase-change random access memory device of claim 6, further comprising a mask that is formed to surround the cylindrical phase-change material layer.

10. A phase-change random access memory device, comprising:
   a bottom electrode contact that is formed in the shape of a cylinder; and
   a cylindrical phase-change material layer that is in contact with the cylindrical bottom electrode contact.

11. The phase-change random access memory device of claim 10, further comprising:
   a circular cylindrical dielectric layer that extends from the cylindrical bottom electrode contact in a lengthwise direction, wherein
   the cylindrical bottom electrode contact is formed on a surface of the circular cylindrical dielectric layer.

12. The phase-change random access memory device of claim 10, wherein the cylindrical bottom electrode contact and the cylindrical phase-change material layer include a dielectric layer therein.

13. The phase-change random access memory device of claim 10, further comprising an interlayer insulating film that is formed to surround the cylindrical bottom electrode contact.

14. The phase-change random access memory device of claim 10, further comprising a mask that is formed to surround the cylindrical phase-change material layer.

* * * * *